United States Patent
Nuebling et al.

(10) Patent No.: US 11,063,583 B2
(45) Date of Patent: Jul. 13, 2021

(54) MULTI-SENSE CIRCUIT FOR PARALLEL-CONNECTED POWER SWITCHES

(71) Applicant: Infineon Technologies AG, Neubiberg (DE)

(72) Inventors: Marcus Nuebling, Olching-Esting (DE); Tom Roewe, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 741 days.

(21) Appl. No.: 15/847,590

(22) Filed: Dec. 19, 2017

(65) Prior Publication Data

US 2019/0190513 A1 Jun. 20, 2019

(51) Int. Cl.
| | |
|---|---|
| *H03K 17/081* | (2006.01) |
| *H02M 3/07* | (2006.01) |
| *H03K 5/1532* | (2006.01) |
| *H03K 17/12* | (2006.01) |
| *H02M 1/32* | (2007.01) |
| *H02M 1/088* | (2006.01) |
| *H03K 17/082* | (2006.01) |
| *H02M 1/00* | (2006.01) |

(52) U.S. Cl.
CPC ...... *H03K 17/08112* (2013.01); *H02M 1/088* (2013.01); *H02M 1/32* (2013.01); *H02M 3/07* (2013.01); *H03K 5/1532* (2013.01); *H03K 17/0828* (2013.01); *H03K 17/127* (2013.01); *H02M 2001/0009* (2013.01)

(58) Field of Classification Search
CPC ........ G01R 19/04; H02M 1/088; H02M 1/32; H02M 2001/0009; H02M 3/07; H03K 17/08112; H03K 17/0828; H03K 17/127; H03K 5/1532
See application file for complete search history.

(56) References Cited

U.S. PATENT DOCUMENTS

| | | | | |
|---|---|---|---|---|
| 9,152,163 | B1* | 10/2015 | Fabbro | G05F 3/205 |
| 2011/0102246 | A1* | 5/2011 | Moulton | G01S 7/032 |
| | | | | 342/159 |
| 2014/0340124 | A1* | 11/2014 | Hirler | H03K 3/012 |
| | | | | 327/108 |
| 2017/0093387 | A1* | 3/2017 | Zhu | H02H 1/0007 |

FOREIGN PATENT DOCUMENTS

JP 04217859 A * 8/1992

OTHER PUBLICATIONS (IEEE Xplore Digital Library [online], ieeexplore.ieee.org [retrieved on May 2011], Retrieved from the Internet: <URL:https://ieeexplore.ieee.org/stamp/stamp.jsp?tp=&arnumber=6020357&tag=1> (Year: 2011).*

* cited by examiner

*Primary Examiner* — Jared Fureman
*Assistant Examiner* — Nicolas Bellido
(74) *Attorney, Agent, or Firm* — Slater Matsil, LLP

(57) ABSTRACT

A multi-sense circuit includes a transistor circuit having sense nodes and a gate node, a peak detector having inputs coupled to the sense nodes of the transistor circuit and an output, and a control circuit having a gate control node coupled to the gate node of the transistor circuit and an overcurrent protection node coupled to the output of the peak detector.

20 Claims, 6 Drawing Sheets

US 11,063,583 B2

MULTI-SENSE CIRCUIT FOR PARALLEL-CONNECTED POWER SWITCHES

TECHNICAL FIELD

The present invention relates generally to a multi-sense circuit and method for power switches.

BACKGROUND

Power transistors are used to switch relatively high power, and can carry relatively high currents and/or block relatively high voltages. As a result, heat is typically generated by the power transistor, even during normal operating conditions. Power transistors typically have a maximum operating temperature that can be reached and even exceeded by operating in an overcurrent or overvoltage condition for a sufficient length of time. Sensing circuits are sometimes used to sense the overcurrent or overvoltage condition and to generate an output signal that can be used to safely shut down the power transistor before it is permanently damaged.

SUMMARY

In an embodiment, a circuit comprises a transistor subcircuit having a plurality of sense nodes and a gate node; a peak detector having a plurality of inputs coupled to the plurality of sense nodes of the transistor subcircuit, and an output; and a control subcircuit having a gate control node coupled to the gate node of the transistor subcircuit and an overcurrent protection node coupled to the output of the peak detector. The transistor subcircuit can comprise a plurality of parallel-connected transistors, each transistor of the plurality of parallel-connected transistors having a collector coupled to a first current node of the transistor subcircuit, an emitter coupled to a second current node of the transistor subcircuit, and a gate coupled to the gate node of the transistor subcircuit. Each transistor of the plurality of parallel-connected transistors can further comprise an additional emitter coupled to a respective sense node of the plurality of sense nodes. Each transistor of the plurality of parallel-connected transistors can further comprise a sense resistor coupled to a respective sense node of the plurality of sense nodes. The peak detector can comprise a plurality of diodes, each diode of the plurality of diodes having an anode respectively coupled to an input of the plurality of inputs of the peak detector and a cathode coupled to the output of the peak detector. The peak detector can further comprise an additional diode coupled between a ground and a reference output of the peak detector, a first resistor coupled between the output of the peak detector and a voltage source, and a second resistor coupled between the reference output of the peak detector and the voltage source. The voltage source can comprise a negative voltage source. The reference output of the peak detector can be coupled to an overcurrent protection ground node of the control subcircuit. The transistor subcircuit can comprise a plurality of transistors and the peak detector can comprise a plurality of diodes, wherein the plurality of transistors and the plurality of diodes can be integrated together in a module. The peak detector can comprise a plurality of diodes that are integrated together in a module.

In an embodiment, a circuit comprises a plurality of diodes, each diode having an anode respectively coupled to a corresponding sense node, and a cathode coupled to an overcurrent protection node; a plurality of resistors, each resistor respectively coupled between the corresponding sense node and ground; a first additional resistor coupled between the overcurrent protection node and a negative voltage source; a first additional diode coupled between ground and an overcurrent protection ground node; and a second additional resistor coupled between the overcurrent protection ground node and the negative voltage source. The plurality of diodes can be coupled to a corresponding plurality of transistors and integrated together in a module. The plurality of diodes can be integrated together in a module. The circuit can further comprise a control subcircuit coupled to the overcurrent protection node and the overcurrent protection ground node. The negative voltage source can comprise a charge pump.

In an embodiment, a method of protecting a plurality of transistors comprises sensing an emitter voltage of each of the plurality of transistors; detecting a peak emitter voltage; and using the detected peak emitter voltage to turn off at least one of the plurality of transistors. Sensing can comprise sensing a sense emitter voltage of each of the plurality of transistors. Detecting can comprise energizing one of a plurality of diodes, each diode of the plurality of diodes being associated with a respective transistor of the plurality of transistors. Detecting can further comprise respectively coupling a plurality of resistors to the plurality of diodes. Using the detected peak emitter voltage can comprise coupling the detected peak emitter voltage to a control circuit in communication with the plurality of transistors.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

A sense output can be implemented in a power switch (MOS, IGBT), which provides a small portion of the current through the power switch to an extra pin in a module or integrated circuit. An external sense resistor can be coupled to the extra pin and the voltage value across the external sense resistor, which is proportional to the total current flowing through the power switch, can be used to evaluate overload conditions. The voltage across the external sense resistor is typically evaluated via an overcurrent protection pin (commonly referred to as OCP pin) and, perhaps, an overcurrent protection ground pin (commonly referred to as OCPG pin) in a power switch driver and/or control integrated circuit or module.

A problem can occur when several power switches are connected in parallel, and only one pin (e.g. OCP pin) or set of pins (e.g. OCP pin and OCPG pin) of the power switch driver circuit is available for evaluation. If, for example, four power switches are connected in parallel, each with their own sensing node, only one of the four power switches can be evaluated. The particular case of four power switches being connected in parallel is only given for illustration purposes and any number of power switches being connected in parallel could be envisaged.

A circuit solution to the above problem according to an embodiment detects the highest value of current that flows in one of the parallel-connected power switches, since the power switch that is most strongly loaded with the highest current will be of the most concern in an evaluation. The information from the other power switches is not necessary to provide the overcurrent information that can be used to turn off the failed power switch or an entire module of power switches.

While an additional evaluation pin or pins could be implemented in the driver integrated circuit for each further parallel power switch, a disadvantage with this solution is the higher costs incurred associated with larger package sizes. If enough additional evaluation pins are required, a sufficiently large package may not even be available.

Another possible solution is the connection of all of the sensing resistors for each parallel-connected power transistor to a single evaluation pin or set of pins. This solution leads to the sense current of the other power switches being distributed in the event of a failure of an individual power switch. In this instance, the current through the failed power switch will not increase and the average current flowing through the remaining power switches will be measured. By sensing the average of the resistances, the individual maximum current in any one of the power switches is no longer measurable. The higher unmeasured load current can lead to destruction of the corresponding power switch since an evaluation will not detect that a maximum load current has been reached.

Figure 1:
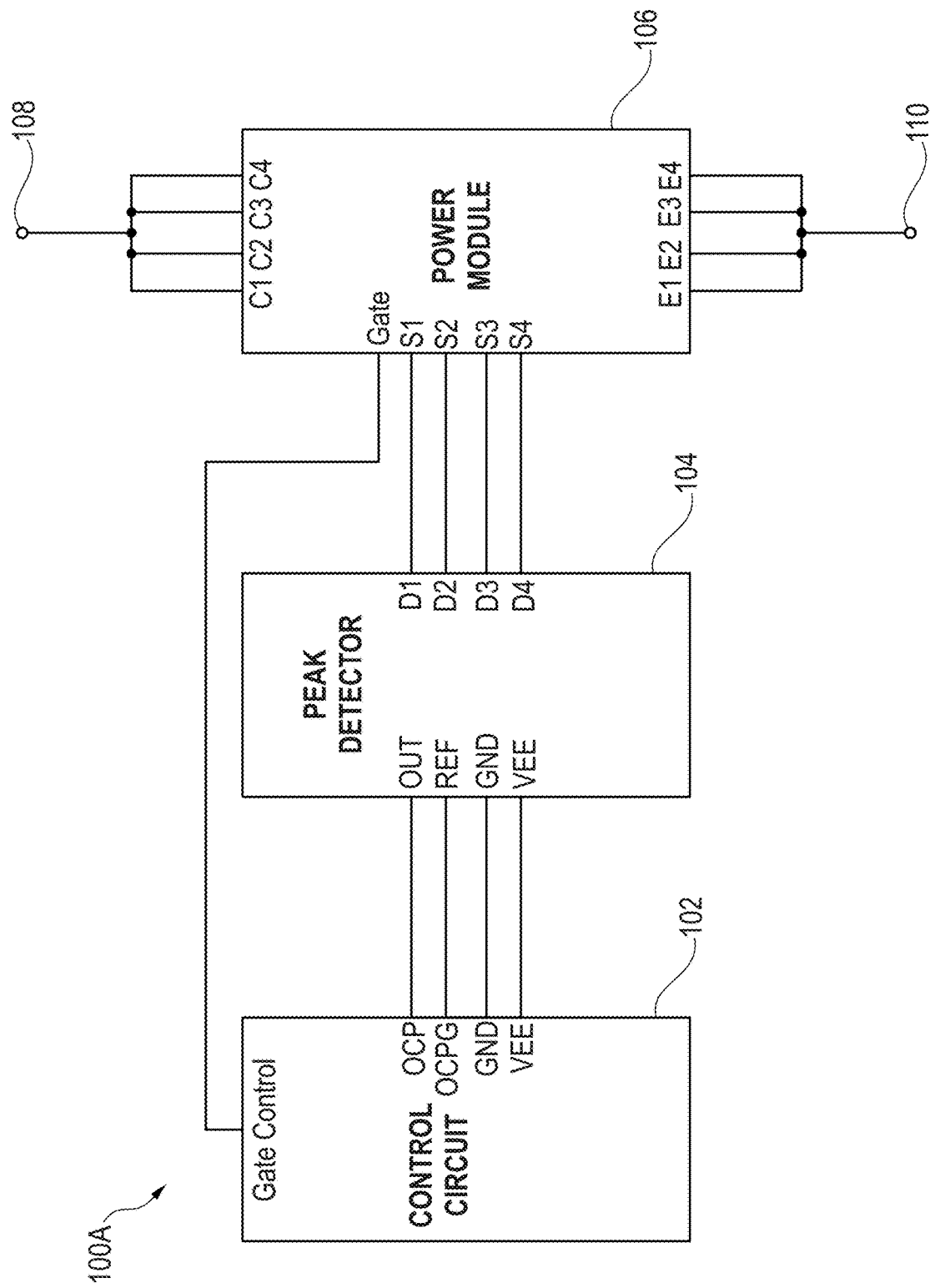
FIG. 1 is a block diagram of an embodiment of a multi-sense circuit for power switches.

An overall block diagram of the multi-sense circuit 100A according to an embodiment is shown in FIG. 1. The multi-sense circuit 100A includes a control circuit 102, a peak detector 104, and a power module 106 comprising a plurality of power switches.

The control circuit 102 includes a gate control node (Gate Control) for driving a corresponding gate node (Gate) in the power module 106. The control circuit 102 also includes sensing and logic circuits coupled to the OCP and OCPG pins. The control circuit 102 also includes ground (GND) and power source (VEE) pins.

The peak detector 104 comprises a plurality of input nodes D1, D2, D3, and D4 and an output node OUT, which is coupled to the OCP node of control circuit 102. The peak detector 104 also includes a reference output node REF, which is coupled to the OCPG node of the control circuit 102. The REF output node of peak detector 104 supplies a levelshifting diode drop voltage from ground that compensates for other peak detector diode circuitry as will be explained in further detail below. The peak detector 104 also includes a ground node GND that is coupled to the corresponding ground node GND of the control circuit 102. The peak detector 104 also includes a voltage source node VEE that is coupled to the corresponding voltage source node VEE of the control circuit 102.

Power module 106 comprises a plurality of sense nodes S1, S2, S3, and S4 that are coupled to the input nodes D1, D2, D3, and D4 of peak detector 104. Power module 106 includes a Gate node that is coupled to the Gate Control node of control circuit 102, as previously discussed. Power module 106 comprises a plurality of current input nodes C1, C2, C3, and C4 coupled to a first current node 108, a plurality of current output nodes E1, E2, E3, and E4 coupled to a second current node no.

The internal circuitry of control circuit 102, peak detector 104, and power module 106 are explained in further detail below with respect to FIGS. 2, 3, 4, and 5.

Figure 2:
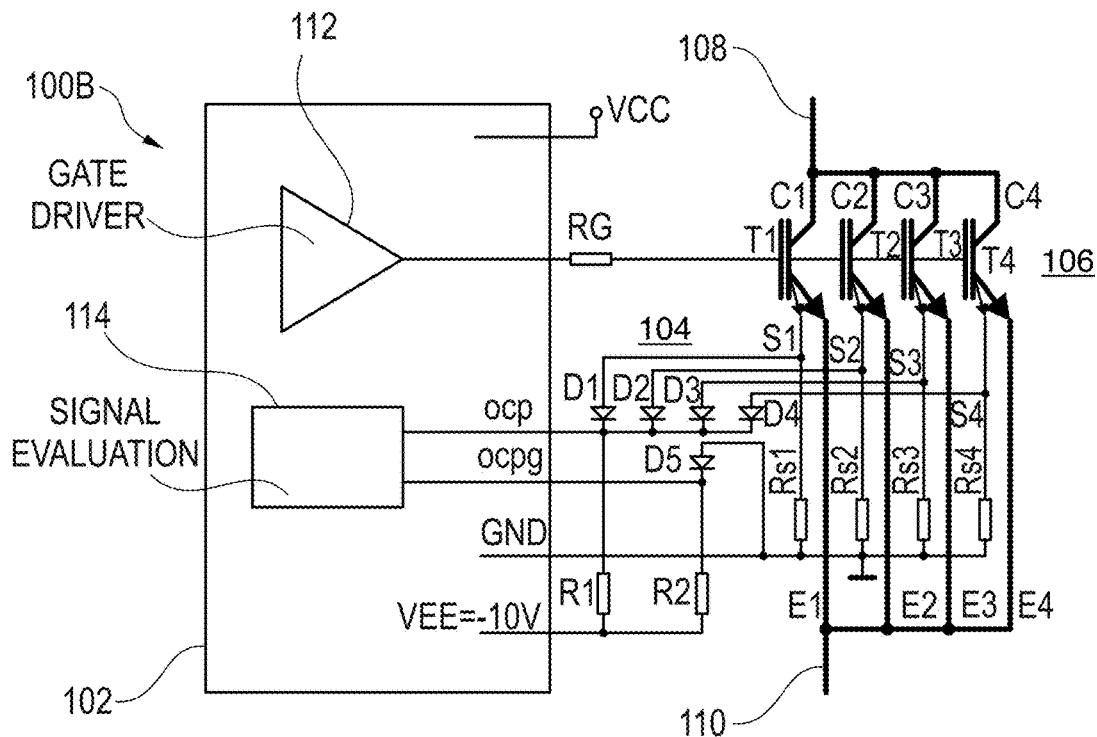
FIGS. 2-5 are schematic diagrams of embodiments of a multi-sense circuit for power switches.

In a multi-sense circuit embodiment 100B, shown in FIG. 2, there is a bipolar supply voltage available (both positive VCC and negative VEE voltages are available, which is typical for power switches such as IGBTs since the gate is negatively biased with respect to the emitter in the event of disconnection, in order to counteract capacitive coupling, i.e., the Miller effect).

In FIG. 2, the circuit embodiment 100B shown solves the above discussed pin availability problem using a diode array D1, D2, D3, D4, and D5 with associated biasing. The anodes of diodes D1, D2, D3, and D4 form the input nodes of the diode array as previously described. The input nodes of diodes D1, D2, D3, and D4 are respectively coupled to the sense nodes S1, S2, S3, and S4 of power switches T1, T2, T3, and T4 that are described in further detail below. The coupled cathodes of diodes D1, D2, D3, and D4 form the output node of the diode array coupled to the OCP pin of control circuit 102 as previously described. The coupled cathodes of diodes D1, D2, D3, and D4 are also coupled to resistor R1, which is in turn coupled to the voltage source node VEE, which in the embodiment of FIG. 2 is shown as VEE=−10 volts and is supplied by an external negative voltage power supply. The anode of diode D5 is coupled to ground and the cathode of diode D5 is coupled to resistor R2, which in turn is coupled to the voltage source node VEE. The cathode of diode D5 also supplies a levelshifting voltage to the OCPG pin of control circuit 102.

Four power switches T1, T2, T3, and T4 with corresponding current output nodes E1, E2, E3, and E4, and sense nodes S1, S2, S3, and S4 are connected in parallel. In the embodiment 100B shown in FIG. 2 current output nodes E1, E2, E3, and E4 are emitter nodes and carry the majority of the current output. The sense nodes S1, S2, S3, and S4 are sense emitter nodes and carry a small linear ratioed portion of the total output current. In an example, the current flowing out of a sense node will represent $\frac{1}{1000}$ or 0.1% of the total current of the corresponding power switch. Other ratios of emitter current to sense emitter current can be used. In the embodiment of FIG. 2, IGBTs are shown to realize power switches T1, T2, T3, and T4, but of course other types of devices can be used such as MOS transistors, or silicon carbide transistors, as well as other types of power switches known in the art. The current input nodes (collectors in the embodiment of FIG. 2) C1, C2, C3, and C4 of power switches T1, T2, T3, and T4 are coupled together and to node 108. The current output nodes E1, E2, E3, and E4 (emitters in the embodiment of FIG. 2) are coupled together and to node no. The sense nodes S1, S2, S3, and S4 are coupled to the anodes of diodes D1, D2, D3, and D4, and also to a first end of corresponding sense resistors Rs1, Rs2, Rs3, and Rs4. A second end of corresponding sense resistors Rs1, Rs2, Rs3, and Rs4 are coupled together and to ground.

Control circuit 102 includes a gate driver circuit 112 that is coupled through gate resistor RG to the gates of power switches T1, T2, T3, and T4. Control circuit 102 also includes a signal evaluation circuit 114 coupled to nodes OCP and OCPG. The signal evaluation circuit 114 is described in further detail with respect to the schematic of FIG. 6, and the gate driver circuit 112 is described in further detail with respect to the schematic of FIG. 7.

Figure 3:
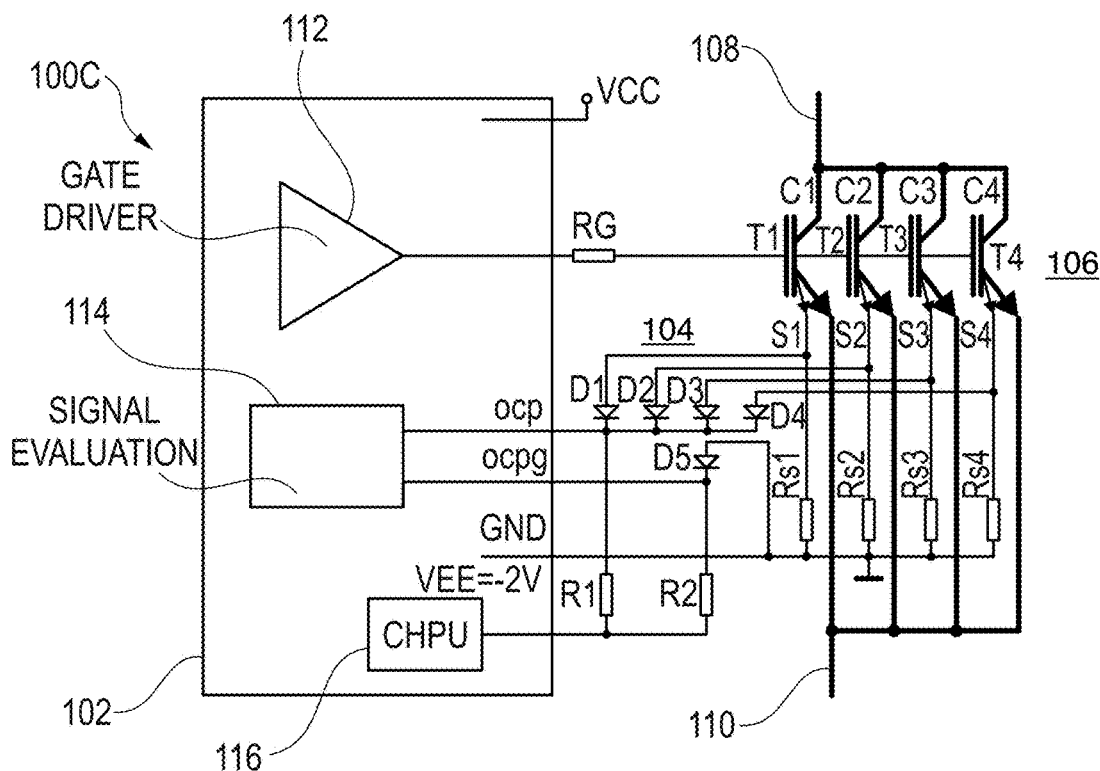

In another multi-sense circuit embodiment 100C, shown in FIG. 3, there is only one unipolar supply voltage available (VCC). In FIG. 3, circuit 100 solves the above discussed pin availability problem by the same diode array with appropriate biasing as discussed above but also includes a charge pump (CHPU) 116. A corresponding realization is shown in FIG. 3 in which four power switches T1, T2, T3, and T4 with corresponding sense outputs are connected in parallel as was previously discussed with respect to FIG. 2.

In the embodiment of FIG. 3, the negative voltage (shown as VEE=−2 volts) required for biasing the negative level shifting voltage of the diodes is provided internally and realized by a charge pump 116. Charge pump 116 can typically include a plurality of serially-coupled stages for gradually building up a negative voltage where the negative voltage is not externally provided, as is known in the art. The serially-coupled stages typically include a diode and a capacitor, or a switch and a capacitor. Many types of charge pump circuits are appropriate for use in charge pump 116. Otherwise, the functionality of circuit 100C is as discussed above with respect to FIG. 2.

Figure 4:
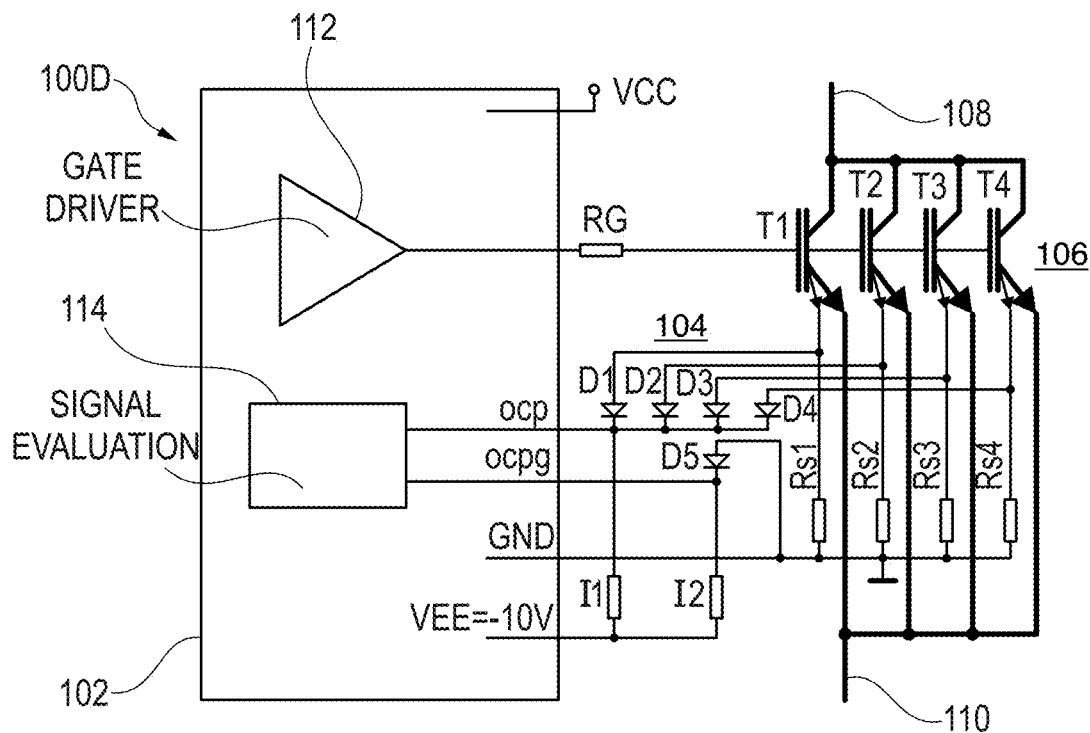

FIG. 4 is a schematic diagram of an embodiment of a multi-sense circuit 100D for power switches wherein resistors R1 and R2 of embodiment multi-sense circuit 100B shown in FIG. 2 are replaced by current sources I1 and I2, respectively. Current sources I1 and I2 can be sized to provide a similar current to the current flowing in, for example, resistor R2 in multi-sense circuits 100B and 100C previously described. Other lower current values can also be used for current sources I1 and I2. Current sources I1 and I2 can be realized with a multiple output current mirror (not shown in FIG. 4), in an embodiment.

Figure 5:
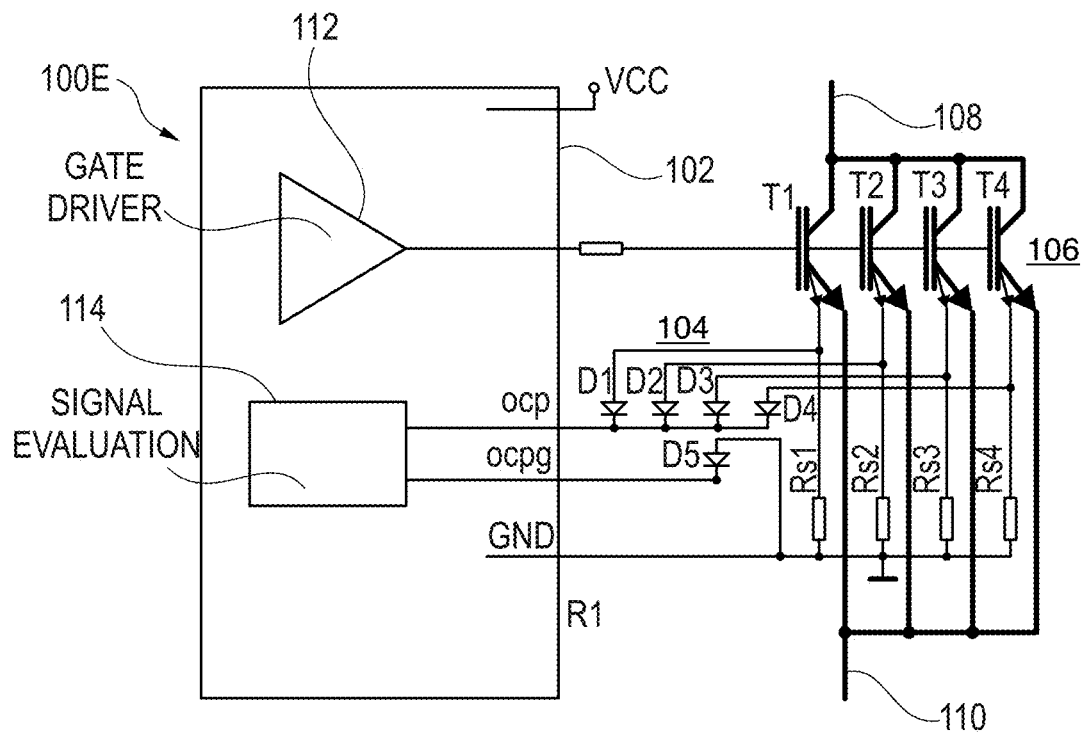

FIG. 5 is a schematic diagram of an embodiment of a multi-sense circuit 100E for power switches wherein resistors R1 and R2 of embodiment multi-sense circuits 100B and 100C shown in FIGS. 2 and 3 are eliminated altogether. In the multi-sense circuit 100E the only load for diodes D1-D5 is provided by the input impedance of the signal evaluation circuit 114. In some embodiments of multi-sense circuit 100E a filter (such as a small value capacitor) may be coupled between the OCP and OCPG nodes.

Figure 6:
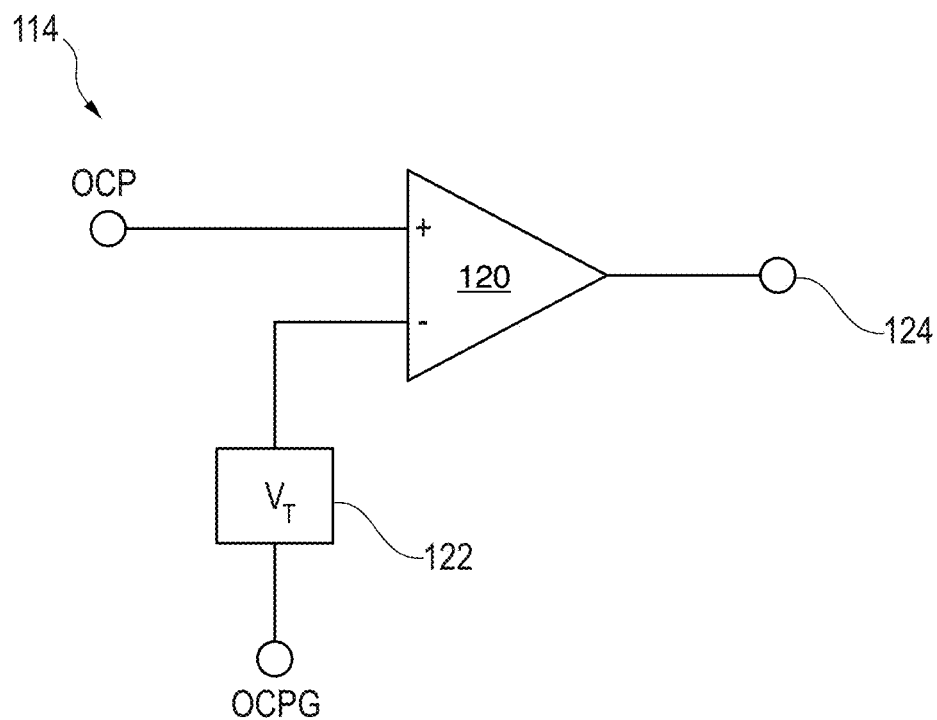
FIG. 6 is a schematic diagram of an embodiment of an evaluation circuit within the multi-sense circuit for generating an overcurrent signal.

FIG. 6 shows an evaluation circuit 114 including a comparator 120 having a first input coupled to the OCP pin, a second input coupled to a threshold voltage generator 122, and an output 124 for providing an overcurrent signal 124. The overcurrent signal 124 is used by control circuit 102 or by control circuit 102 in conjunction with other systems or circuits not shown in FIGS. 1-5 to shut down or otherwise change the operating condition of at least one of the power switches T1-T4, or to provide a warning signal that at least one of the power switches T1-T4 is in an overcurrent mode. In operation, if the OCP node voltage (normal operation) is below the threshold voltage (VT) referenced to the OCPG node voltage, then an overcurrent signal is not generated and the output 124 of the comparator 120 is low. If the OCP node voltage (short-circuit or overcurrent condition detected) is above the threshold voltage referenced to the OCPG node voltage, then an overcurrent signal is generated and the output 124 of the comparator 120 is high.

In an example provided below with respect to Tables I and II, the OCPG node voltage is given as −600 mV. For a maximum allowable current flow, a corresponding peak OCP node voltage is given as −500 mV. For an overcurrent current flow, a corresponding peak OCP node voltage is given as −300 mV. Thus, an appropriate value of the overcurrent threshold voltage for the threshold voltage generator 122 would be 200 mV. When referenced to the OCPG node voltage, the negative input of comparator 120 would provide a midpoint voltage of −400 mV that is between the peak voltage generated by the maximum allowable current flow (−500 mV) and the peak voltage generated by the overcurrent (short-circuit) current flow (−300 mV). Other threshold voltages are of course possible to accommodate other maximum allowable currents in a given application.

FIG. 6 shows an evaluation circuit that is primarily analog in nature. However, the comparison of the OCP node voltage to a threshold voltage can be accomplished in the digital domain as well. For example, an ADC could be used to convert the differential voltage OCP-OCPG into a digital value. This digital value is then compared with another digital value (overcurrent threshold) in the digital domain. If the threshold is reached the gate driver circuit 112 can be switched off (or switched to another safe state). The overcurrent threshold can be a fixed value or programmed by a user via a SPI interface or a CAN interface as desired.

Figure 7:
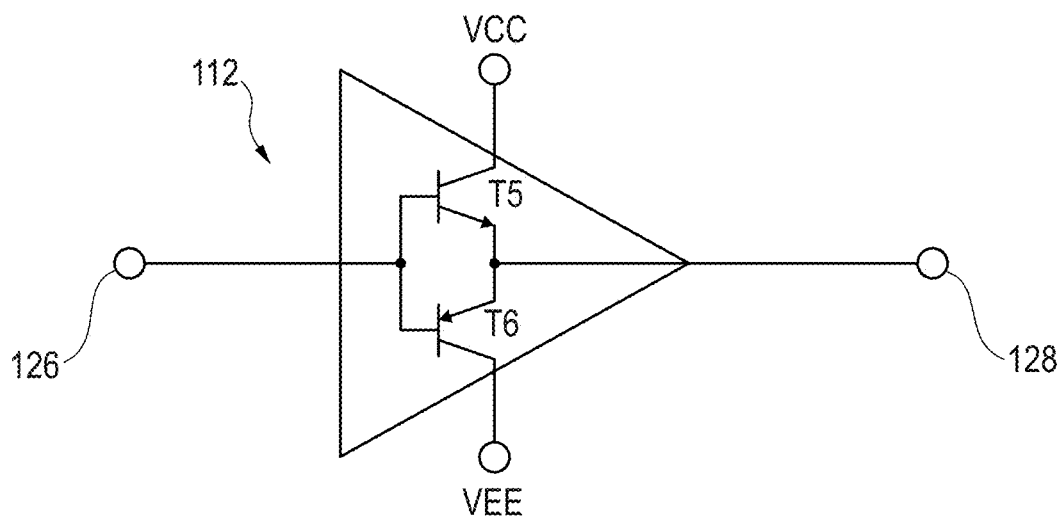
FIG. 7 is a schematic diagram of an embodiment of a gate driver circuit within the multi-sense circuit for driving the gate of a plurality of power switches.

FIG. 7 shows an example of a gate driver circuit 112. Gate driver circuit provides large driving current for short amounts of time due to the capacitive nature of the gates of the power switches that are being driven. An example of a basic driving circuit 112 is shown in FIG. 7, which includes an NPN driving transistor T5 having a collector coupled to VCC, an emitter coupled to output driving node 128, and a gate coupled to input node 126. Driving circuit 112 also includes a PNP driving transistor T6 having a collector coupled to VEE, an emitter coupled to output driving node 128, and a gate coupled to input node 126. Of course, gate driver circuit 112 can also include other supporting input and compensation circuitry, not shown, and many other driving circuits can also be used to provide the required gate driving currents.

In operation, diodes D1, D2, D3, and D4 realize a level shift with respect to resistor R1, which is coupled to VEE. In FIG. 2, VEE is externally provided and shown as −10 volts. The signal at the common connection of diodes D1, D2, D3, D4, and resistor R1 is passed to the OCP pin. The OCP signal is a peak detected signal that detects the greatest value of respective signals at sense nodes S1, S2, S3, and S4, which corresponds to the largest current flowing through a respective power switch T1, T2, T3, or T4. Diode D5 connected to resistor R2 also realizes a level shift that compensates the voltages and the temperature coefficient of diodes D1 to D4 (for a differential signal evaluation at the OCP and OCPG pins). Ideally, therefore, diodes D1 to D5 should be of the same type and should be located as close together as possible so that they experience the same operating temperature and so that their voltages will vary in the same manner. The biasing of the level shift can also be realized alternatively with current sources (best shown in FIG. 4) instead of resistors. The diodes can also be replaced by any component having a rectifier effect.

For a fuller understanding of the peak detection provided by embodiments, the following Tables I and II are used to show relevant node voltages as well as diode states, and the state of the overcurrent signal. The OCP pin voltage, in particular, is shown in relation to the other circuit voltages so that the method of operation of the circuits shown in FIGS. 2 and 3 can be more easily appreciated. The method of operation of the circuits shown in FIGS. 4 and 5 is very similar, although some of the operating currents are different.

In Table I, an S4 value (the highest sense voltage) of 100 mV reflects an operating condition with a high current in power switch T4, but one that does not trigger an overcurrent signal. In Table II, an S4 value (the highest sense voltage) of 300 mV reflects an overcurrent condition in power switch T4 with a high current that does trigger an overcurrent signal.

The following typical values are used in Tables I and II: R1=5K ohms, R2=5K ohms, Rs1=0.5 ohms, Rs2=0.5 ohms, Rs3=0.5 ohms, Rs4=0.5 ohms, VEE=−10 volts or −2 volts. All of the corresponding power switch currents are easily found by dividing the given voltages by the above resistor values and multiplying by the ratio of the emitter size to the sense emitter size. Table I illustrates the sense node voltages, the OCP and OCPG pin voltages, and the state of the overcurrent signal output and diodes in a normal mode of operation.

TABLE I

| Normal Operation | | | | | | |
|---|---|---|---|---|---|---|
| S1 voltage | S2 voltage | S3 voltage | S4 voltage | OCP voltage | OCPG voltage | OVERCURRENT state |
| 50 mV | 60 mV | 80 mV | 100 mV | −500 mV | −600 mV | LOW |
| D1 state | | D2 state | | D3 state | D4 state | D5 state |
| OFF | | OFF | | OFF | ON | ON |

In Table I, it is important to note that the overcurrent signal is not triggered, because none of the sense node voltages exceed the example threshold voltage of 200 mV. The threshold voltage is determined by the maximum operating current that can be tolerated by any of the power switches T1 through T4 without damage. Since the anode of diode D4 is coupled to the highest sense node voltage, this diode is turned on, and all of the other diodes D1-D3 are turned off. Diode D5 is always on as it is used to generate a levelshifting voltage to compensate the diode drop of diodes D1, D2, D3, and D4. Diode D5 also compensates the temperature coefficient of diodes D1-D4.

As illustrated in Tables I and II, the most positive voltage is always passed through the corresponding diode to the OCP pin and all of the other diodes are completely or partially switched off (in the case where a similar but lesser voltage exists on one of the sense nodes). The voltage on the OCP pin is then evaluated to determine the existence of a normal operating condition or an overcurrent operating condition with respect to the overcurrent threshold voltage.

Table II illustrates the sense node voltages, the OCP and OCPG pin voltages, and the state of the overcurrent output in an overcurrent mode of operation, wherein at least one (T4) of the power switches is providing more than a maximum allowed amount of current, and thus the voltage of the overcurrent pin OCP is greater than a maximum overcurrent threshold voltage.

TABLE II

| Overcurrent Operation | | | | | | |
|---|---|---|---|---|---|---|
| S1 voltage | S2 voltage | S3 voltage | S4 voltage | OCP voltage | OCPG voltage | OVERCURRENT state |
| 50 mV | 100 mV | 150 mV | 300 mV | −300 mV | −600 mV | HIGH |
| D1 state | | D2 state | | D3 state | D4 state | D5 state |
| OFF | | OFF | | OFF | ON | ON |

In Table II, it is important to note that the overcurrent signal is triggered, because the S4 sense node voltage of 300 mV exceeds the example threshold voltage of 200 mV volts. Similarly, since the anode of diode D4 is coupled to the highest sense node voltage, this diode is turned on, and all of the other diodes D1-D3 are turned off. Diode D5 is always on as it is used to generate a levelshifting reference voltage as was described above.

Tables I and II also pertain to the embodiment 100D in which resistors R1 and R2 are replaced by current sources I1 and I2, and embodiment 100E in which resistors R1 and R2 are eliminated. The current flowing through the diodes D1-D4 will however be different.

The circuits and blocks shown in FIGS. 1-5 can be realized in many different ways to optimize performance in a given application. For example, while four transistors T1, T2, T3, and T4 are shown, any number can be used. Similarly, four diodes D1, D2, D3, and D4 are shown but any number corresponding to the chosen number of transistors can be used.

The circuits shown in FIGS. 1-5 can be realized as discrete components or integrated together in various modules or integrated circuits.

Figure 8:
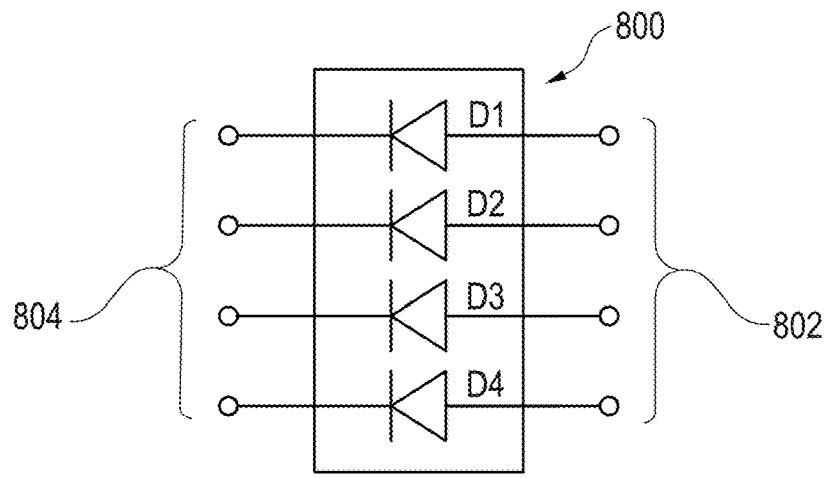
FIG. 8 is a diagram of a diode module suitable for use in the multi-sense circuit according to an embodiment.

In an embodiment shown in FIG. 8, diodes D1, D2, D3, D4, and, optionally diode D5, can all be integrated together into a module or integrated circuit 800. Module 800 includes pins 802 coupled to the anodes of diodes D1-D4 and pins 804 coupled to the cathodes of diodes D1-D4. Optionally, the cathodes 802 can be internally coupled together and brought out to a single pin.

Figure 9:
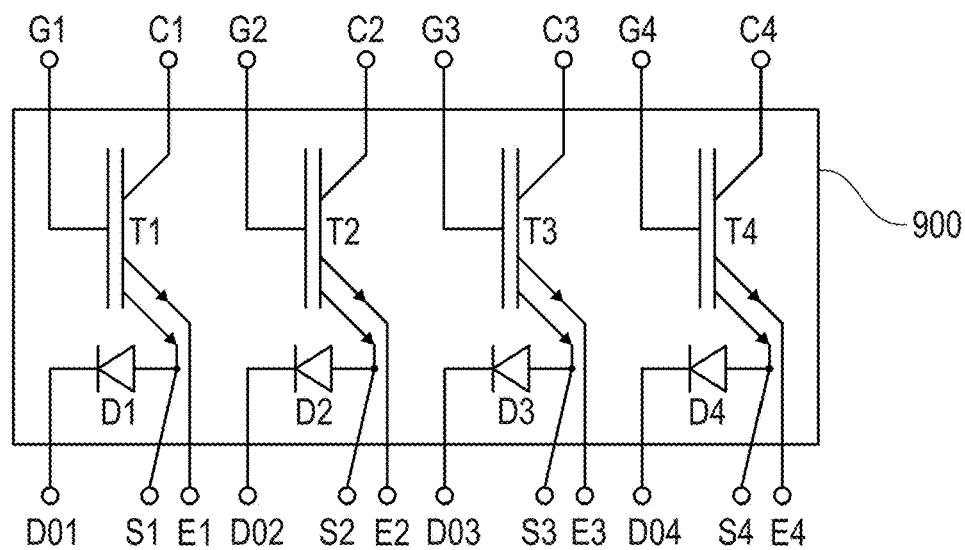
FIG. 9 is a diagram of a combined transistor and diode module suitable for use in the multi-sense circuit according to an embodiment.

In another embodiment shown in FIG. 9, transistors T1, T2, T3, and T4, as well as diodes D1, D2, D3, D4, and D5 can all be interconnected and integrated together into a module or integrated circuit 900. In the embodiment shown in FIG. 9, all of the collectors are brought out to pins C1, C2, C3, and C4, all of the gates are brought out to pins G1, G2, G3, and G4, all of the cathodes are brought out to pins DO1, DO2, DO3, and DO4, and all of the sense nodes are brought out to pins S1, S2, S3, and S4. Optionally, the cathodes can be internally coupled together and brought out to a single pin. Other internal connections can be made as well to accommodate a specific application.

Figure 10:
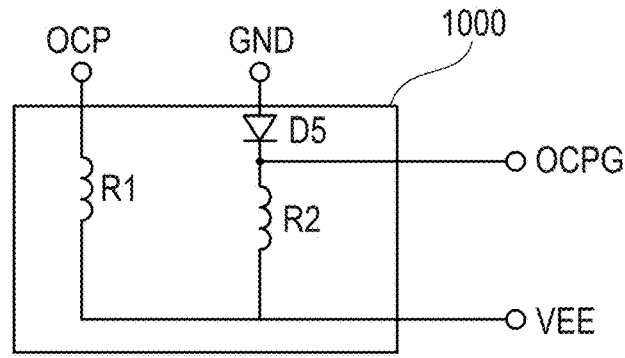
FIG. 10 is a diagram of a combined resistor and diode module suitable for use in the multi-sense circuit according to an embodiment.

In another embodiment shown in FIG. 10, diode D5 and resistors R1 and R2 can be integrated into the control circuit in a module or integrated circuit 1000. In module 1000, the OCP, OCPG, GND, and VEE nodes are all brought out to respective pins. Module 1000 can be integrated together with the other modules described above, or eliminated altogether as was discussed with respect to multi-sense circuit 100E shown in FIG. 3.

Many other groupings of blocks or components in FIGS. 1-5 can be made for integration into one or more modules or integrated circuits as desired for a specific application. The examples of FIGS. 8-10 can be changed to accommodate a specific application. Diodes D1, D2, D3, D4, D5, and biasing resistors R1 and R2 can also be made external at the individual component level to an integrated control circuit and an integrated power transistor module, if desired. The peak detector circuit 104 can be realized with other multiple-input peak detector circuits, if desired and is not limited to the diode circuit implementation shown in FIGS. 1-5.

Figure 11:
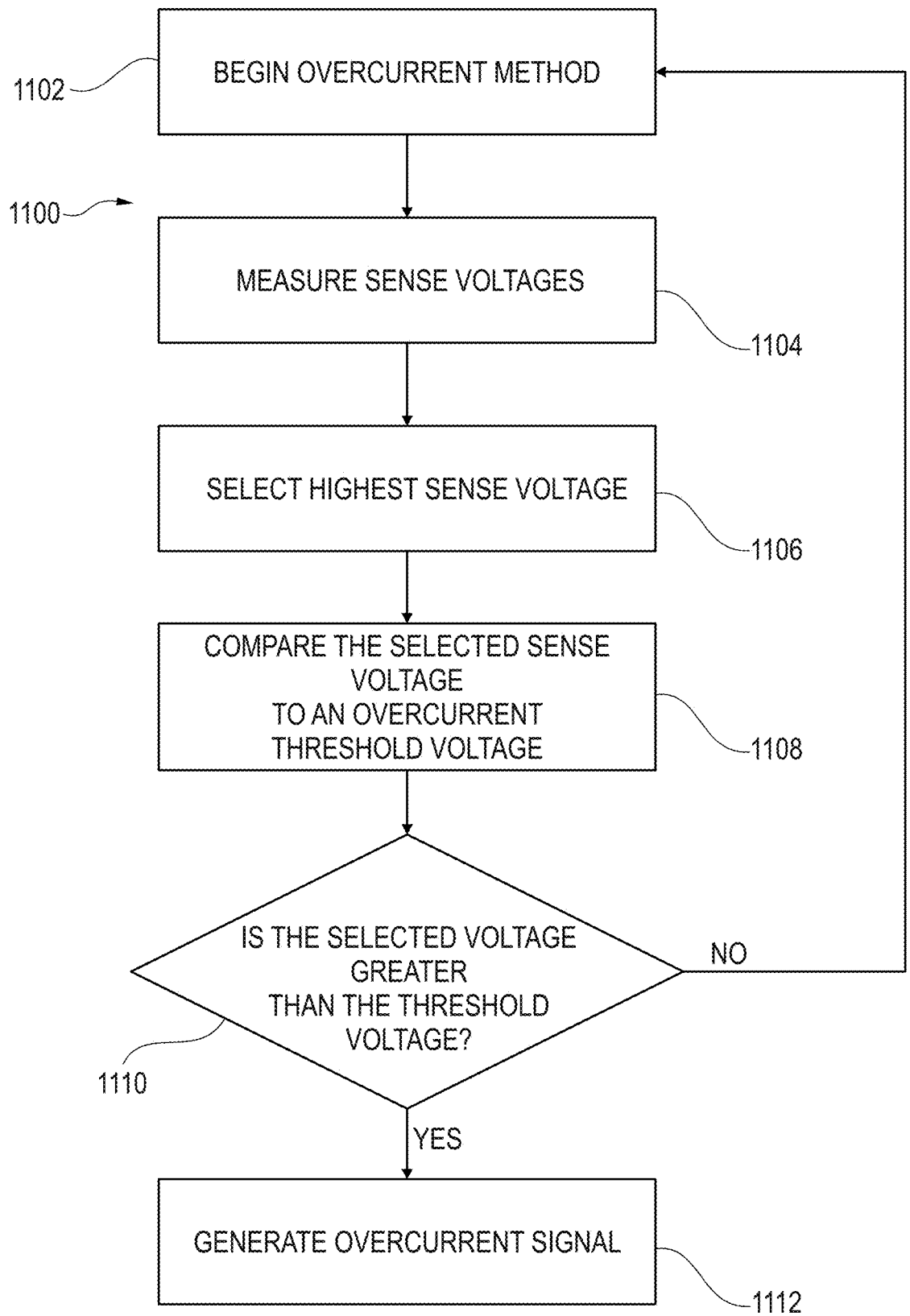
FIG. 11 is a block diagram of an embodiment method of protecting a plurality of transistors.

Referring to FIG. 11, an embodiment method of protecting a plurality of power switches T1-T4 is initialized at step 1102. At step 1104 the voltage at each of the sense nodes S1-S4 of the plurality of power switches T1-T4 is measured or sensed, and at step 1106 the highest sense voltage, which is the peak sense voltage, is selected. Steps 1104 and 1106 are automatically combined by the action of diodes D1-D4 as was previously explained with respect to Tables I and II, but other circuits can be used to provide these functions independently in embodiments. The detected peak voltage, which is the difference between the voltage at the OCP and OCPG nodes, is compared to an overcurrent threshold voltage at step 1108. At decision block 1110, the detected peak voltage is evaluated and it is determined whether or not the detected peak voltage is greater than the overcurrent threshold voltage. If no, the method periodically returns to initialization step 1102. If yes, then the method generates an overcurrent signal at step 1112. In turn, the overcurrent signal can be used by the control circuit or the control circuit in conjunction with other system level circuitry to turn off at least one of the plurality of power switches T1, T2, T3, and T4. Alternatively, a warning signal signaling the presence of an overcurrent condition can be generated.

Detecting the peak voltage comprises energizing one of a plurality of diodes D1-D4 associated with each of the plurality of transistors that are coupled to a plurality of sense resistors Rs1-Rs2. The detected peak sense voltage, once evaluated, is used by a control circuit to take further action such as turning off one or more of the transistors if the OCP voltage is greater than a predetermined threshold voltage or to issue a warning signal in some applications before deciding to turn off one or more of the transistors.

In summary, the current sense outputs from N parallel-connected power switches are peak detected (using diodes D1-D4) to determine a maximum value of the N current sense outputs, which can then be evaluated and used as an overcurrent detection signal. Optionally, a temperature compensation of the circuit (diode D5) is possible to improve performance.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a transistor subcircuit having a plurality of sense nodes and a gate node;
   a peak detector having a plurality of inputs coupled to the plurality of sense nodes of the transistor subcircuit, and an output; and
   a control subcircuit having a gate control node coupled to the gate node of the transistor subcircuit and an overcurrent protection node coupled to the output of the peak detector,
   wherein the transistor subcircuit comprises a plurality of parallel-connected transistors, each transistor of the plurality of parallel-connected transistors having a collector coupled to a first current node of the transistor subcircuit, an emitter coupled to a second current node of the transistor subcircuit, and a gate coupled to the gate node of the transistor subcircuit.

2. The circuit of claim 1, wherein each transistor of the plurality of parallel-connected transistors further comprises an additional emitter coupled to a respective sense node of the plurality of sense nodes.

3. The circuit of claim 1, wherein each transistor of the plurality of parallel-connected transistors further comprises a sense resistor coupled to a respective sense node of the plurality of sense nodes.

4. The circuit of claim 1, wherein the peak detector comprises a plurality of diodes, each diode of the plurality of diodes having an anode respectively coupled to an input of the plurality of inputs of the peak detector and a cathode coupled to the output of the peak detector.

5. The circuit of claim 4, wherein the peak detector further comprises an additional diode coupled between a ground and a reference output of the peak detector, a first resistor coupled between the output of the peak detector and a voltage source, and a second resistor coupled between the reference output of the peak detector and the voltage source.

6. The circuit of claim 5, wherein the voltage source comprises a negative voltage source.

7. The circuit of claim 5, wherein the reference output of the peak detector is coupled to an overcurrent protection ground node of the control subcircuit.

8. The circuit of claim 1, wherein the transistor subcircuit comprises a plurality of transistors and the peak detector comprises a plurality of diodes, wherein the plurality of transistors and the plurality of diodes are integrated together in a module.

9. The circuit of claim 1, wherein the peak detector comprises a plurality of diodes that are integrated together in a module.

10. A circuit comprising:
    a transistor subcircuit having a plurality of sense nodes and a gate node;
    a peak detector having a plurality of inputs coupled to the plurality of sense nodes of the transistor subcircuit, and an output; and
    a control subcircuit having a gate control node coupled to the gate node of the transistor subcircuit and an overcurrent protection node coupled to the output of the peak detector,
    wherein the peak detector comprises a plurality of diodes, each diode of the plurality of diodes having an anode respectively coupled to an input of the plurality of inputs of the peak detector and a cathode coupled to the output of the peak detector.

11. The circuit of claim 10, wherein the peak detector further comprises an additional diode coupled between a ground and a reference output of the peak detector, a first resistor coupled between the output of the peak detector and a voltage source, and a second resistor coupled between the reference output of the peak detector and the voltage source.

12. The circuit of claim 11, wherein the voltage source comprises a negative voltage source.

13. The circuit of claim 11, wherein the reference output of the peak detector is coupled to an overcurrent protection ground node of the control subcircuit.

14. A method of operating a circuit having a transistor subcircuit having a plurality of sense nodes and a gate node; a peak detector having a plurality of inputs coupled to the plurality of sense nodes of the transistor subcircuit, and an output; and a control subcircuit having a gate control node coupled to the gate node of the transistor subcircuit and an overcurrent protection node coupled to the output of the peak detector, wherein the transistor subcircuit comprises a plurality of parallel-connected transistors, each transistor of the plurality of parallel-connected transistors having a collector coupled to a first current node of the transistor subcircuit, an emitter coupled to a second current node of the transistor subcircuit, and a gate coupled to the gate node of the transistor subcircuit, the method comprising:
    detecting a peak voltage produced by the plurality of sense nodes using the peak detector.

15. The method of claim 14, further comprising:
    determining whether the detected peak voltage is greater than an overcurrent threshold voltage; and
    changing an operating condition of at least one of the plurality of parallel-connected transistors based on the determining.

16. The method of claim 15, wherein changing the operating condition comprises coupling the detected peak voltage to a control circuit in communication with the plurality of parallel-connected transistors.

17. The method of claim 14, wherein detecting the peak voltage comprises sensing a sense emitter voltage of each of the plurality of parallel-connected transistors.

18. The method of claim 14, wherein detecting the peak voltage comprises energizing one of a plurality of diodes, each diode of the plurality of diodes being associated with a respective transistor of the plurality of parallel-connected transistors.

19. The method of claim 18, wherein detecting the peak voltage further comprises respectively coupling a plurality of resistors to the plurality of diodes.

20. The method of claim 14, further comprising integrating the transistor subcircuit and the peak detector together in a module.

* * * * *